United States Patent [19]
Rippel et al.

[11] Patent Number: 5,751,150
[45] Date of Patent: May 12, 1998

[54] BIDIRECTIONAL LOAD AND SOURCE CYCLER

[75] Inventors: Wally E. Rippel, Altadena; Darrell Buchanan, Monrovia, both of Calif.

[73] Assignee: AeroVironment, Monrovia, Calif.

[21] Appl. No.: 513,689

[22] Filed: Aug. 11, 1995

[51] Int. Cl.[6] .......................... G01R 31/00; H02M 3/07; H02M 7/12
[52] U.S. Cl. .................. 324/537; 363/37; 363/65; 363/72
[58] Field of Search .................. 324/537, 771, 324/772, 426; 363/37, 65, 72

[56] References Cited

U.S. PATENT DOCUMENTS

| | | | |
|---|---|---|---|
| 3,950,689 | 4/1976 | Jamison | 320/5 |
| 4,789,790 | 12/1988 | Yamanaka | 307/66 |
| 4,894,765 | 1/1990 | Kähkipuro | 363/124 |
| 5,003,453 | 3/1991 | Tighe et al. | 363/65 |
| 5,045,712 | 9/1991 | Baggenstoss | 307/29 |
| 5,159,261 | 10/1992 | Kim et al. | 363/65 X |
| 5,233,286 | 8/1993 | Rozman et al. | 363/37 X |
| 5,247,205 | 9/1993 | Mototani et al. | 307/66 |
| 5,267,135 | 11/1993 | Tezuka et al. | 363/49 |
| 5,332,927 | 7/1994 | Paul et al. | 307/66 |
| 5,345,375 | 9/1994 | Mohan | 363/40 |
| 5,355,294 | 10/1994 | De Doncker et al. | 363/17 |
| 5,363,312 | 11/1994 | Ninomiya | 364/483 |
| 5,371,453 | 12/1994 | Fernandez | 320/5 |
| 5,382,893 | 1/1995 | Dehnel | 320/32 |
| 5,396,165 | 3/1995 | Hwang et al. | 323/210 |
| 5,461,301 | 10/1995 | Truong | 363/37 X |
| 5,530,635 | 6/1996 | Yashiro | 363/65 |
| 5,532,914 | 7/1996 | Kageyama et al. | 363/50 |
| 5,583,753 | 12/1996 | Takayama | 363/71 |
| 5,612,581 | 3/1997 | Kageyama | 307/64 |
| 5,629,844 | 5/1997 | Krichtafovitch et al. | 363/65 |
| 5,659,208 | 8/1997 | Kimble et al. | 307/82 |

Primary Examiner—Glenn W. Brown
Attorney, Agent, or Firm—Burns, Doane, Swecker & Mathis, LLP

[57] ABSTRACT

A system and method for cycling loads and sources can be connected to one or more loads and sources to controllably supply or absorb current with respect thereto. For example, DC voltages can be controllably supplied to each load from a DC bus using a plurality of DC-DC converters. Various DC converter configurations are available including independent, parallel and differential, to expand the types of simulations which can be performed on the load(s).

24 Claims, 4 Drawing Sheets

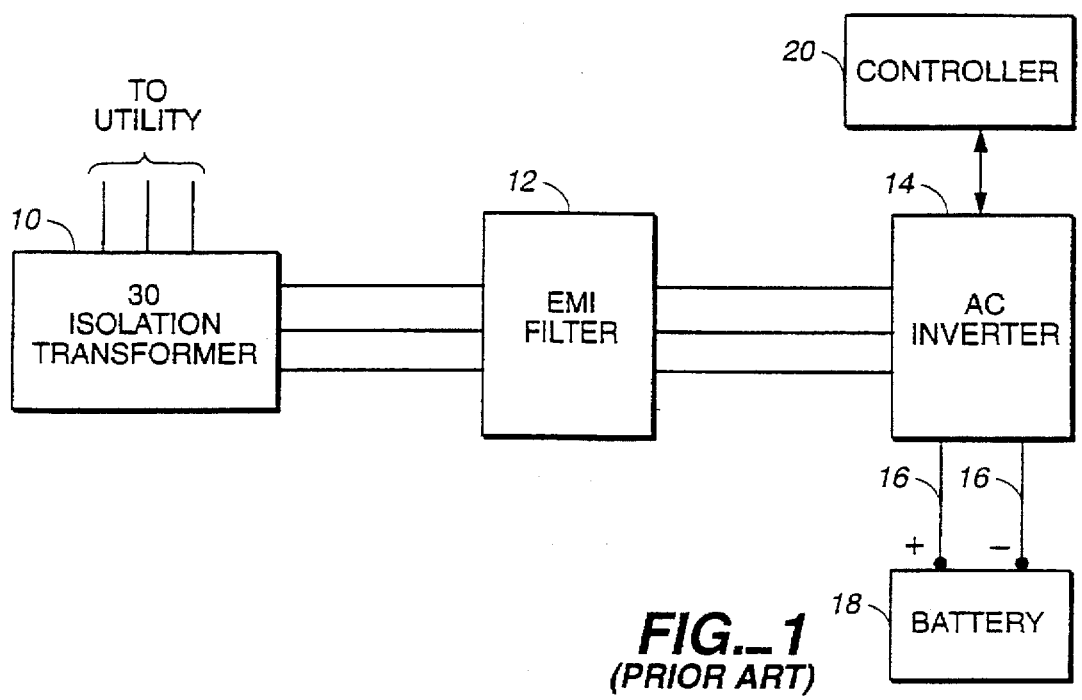
FIG._1 (PRIOR ART)
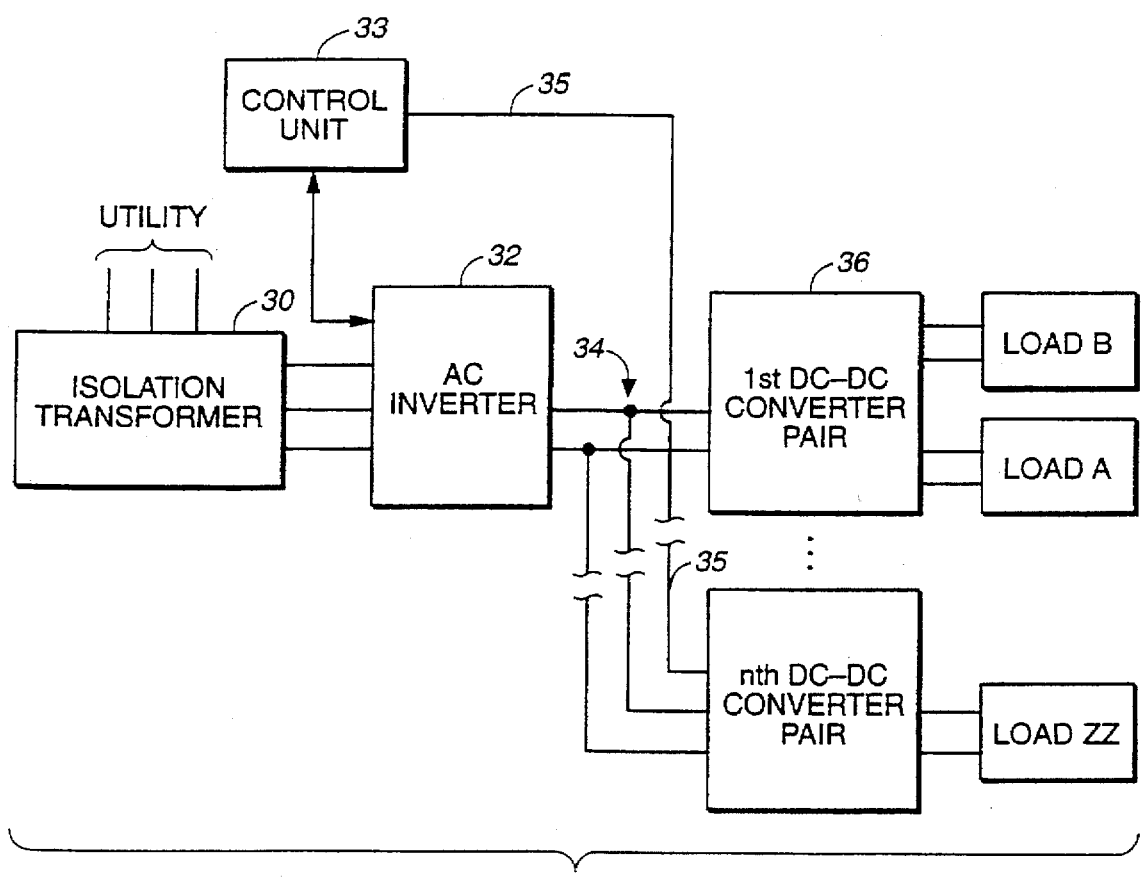
FIG._2

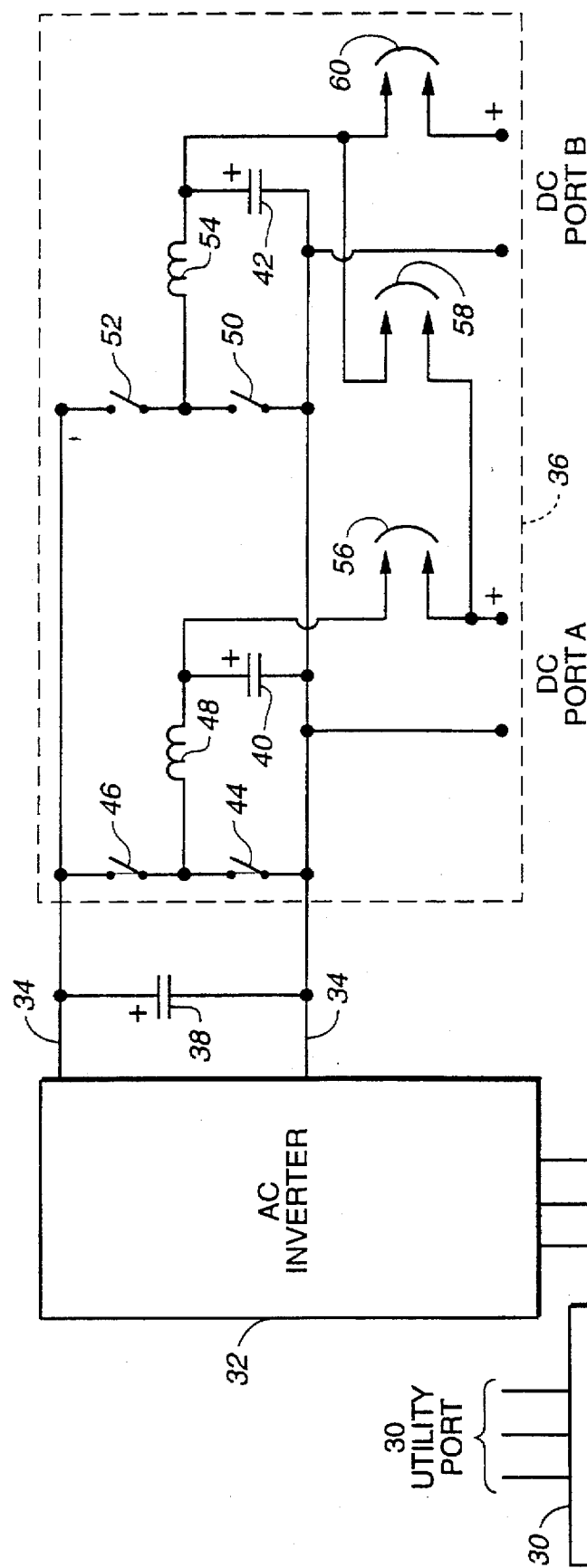
FIG._3

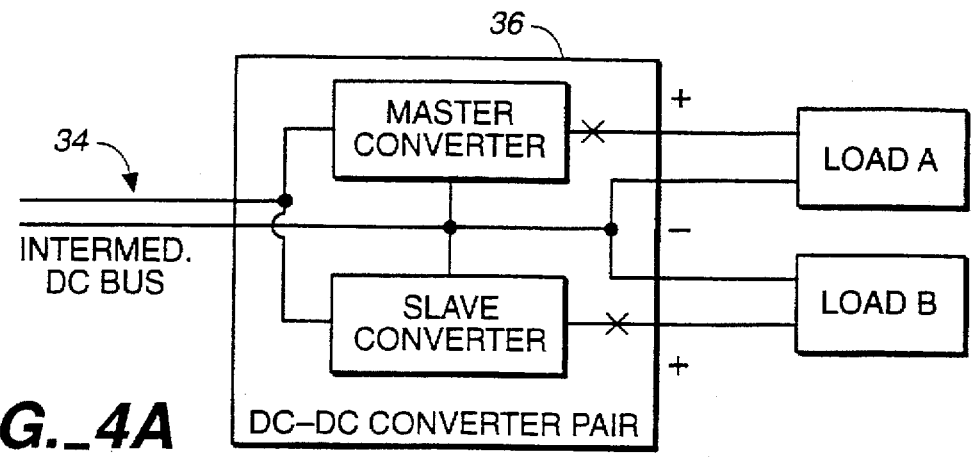
FIG._4A
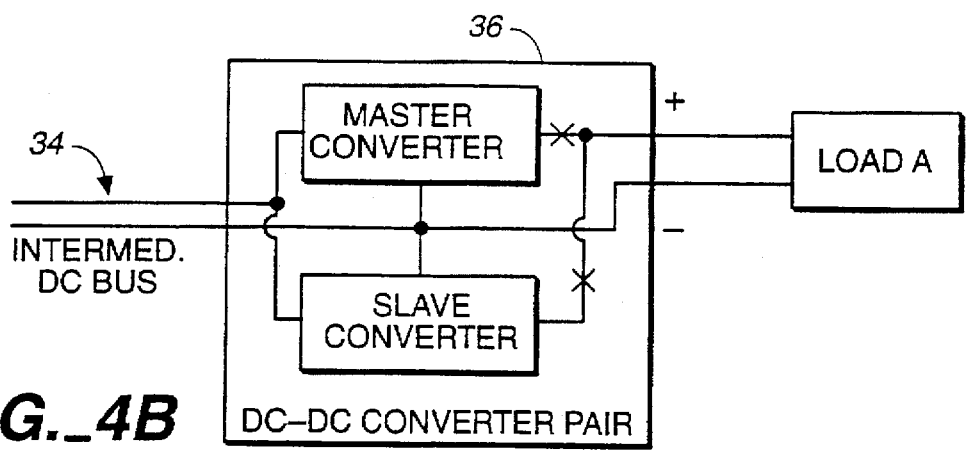
FIG._4B
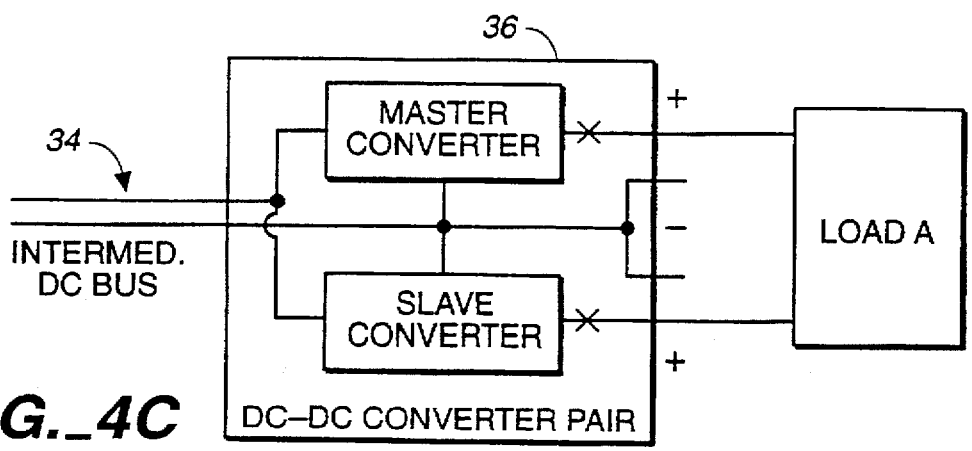
FIG._4C

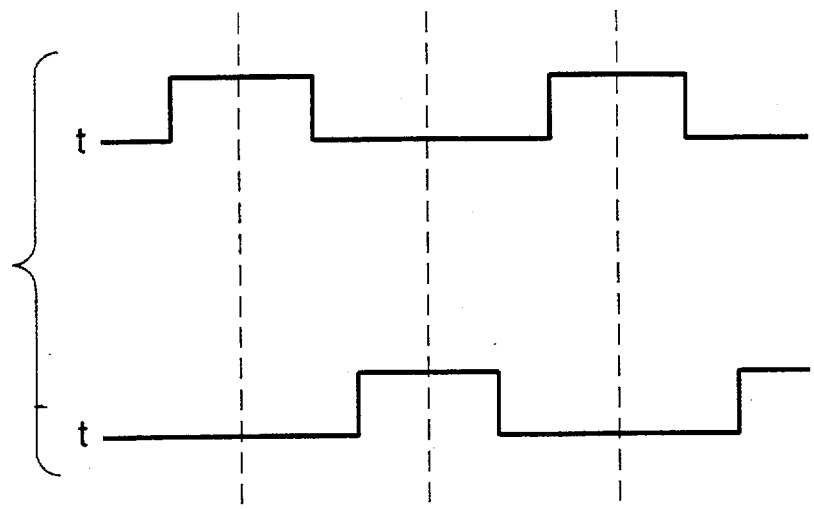
FIG._5A
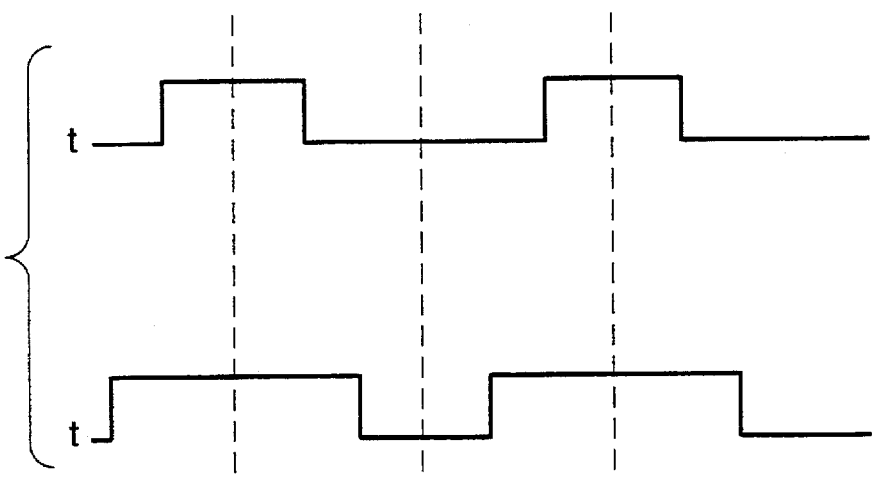
FIG._5B

BIDIRECTIONAL LOAD AND SOURCE CYCLER

BACKGROUND OF THE INVENTION

1. Field of the Invention

The present invention relates generally to electrical test equipment and, more specifically, to a method and apparatus for testing electrical sources and loads, such as batteries and motors.

2. State of the Art

As transportation continues to evolve, electricity is a popular candidate for replacing fossil fuels, particularly in the area of personal transportation. Examples of attempts to replace fossil fuels with electricity include vehicles which are powered by batteries which recharge either via connection to the local power grid or using solar energy which has been converted into electricity. A common denominator in these efforts is the need for an electrical storage device, i.e., a battery, which can supply a wide range of power requirements for electric vehicles.

Batteries which are intended as a primary power source will necessarily require sophisticated battery testing equipment. For example, batteries which are to be used to power electric vehicles may experience many different patterns of rapid discharging and recharging caused by the acceleration and regenerative braking of these vehicles. Thus, a need exists for a way in which widely varying power demands can be simulated to test such batteries, as well as other types of loads and even electrical devices which can act as loads or sources, e.g., motors.

FIG. 1 shows a prior art battery testing system. Therein, a three phase isolation transformer 10 and electromagnetic interference (EMI) filter 20 are connected to a power utility (not shown). The isolation transformer 10 provides protection against, for example, electric shocks, while the EMI filter 20 suppresses noise and interference in the currents flowing to and from the utility port. The output of the EMI filter 20 is provided as an input to the three phase AC adaptor/invertor 14, which transforms the filtered AC input voltage into a predetermined DC bus voltage in a manner which is well known in the art. The voltage applied across the terminals of the DC bus 16 is varied by controller 20 to charge and discharge battery 18 according to various simulations.

The system of FIG. 1 has several practical drawbacks. First, only one battery can be tested at a time. Second, the battery being tested must be of a higher voltage rating than the peak line voltage produced by the AC invertor 14. Thus, while the system illustrated in FIG. 1 can be used to test a high voltage electric vehicle battery, e.g., on the order of 320 volts, it lacks the ability to test lower voltage batteries and battery sub-elements, e.g., cells.

SUMMARY OF THE INVENTION

The present invention, generally speaking, provides an improved method and system for flexibly and efficiently testing electrical sources and loads, such as batteries and motors. The system of the present invention includes, for example, a plurality of DC-DC voltage converters which provide a wide variety of test voltages and currents to one or more devices under test. According to one exemplary embodiment of the present invention, each DC-DC converter can be operated independently to test a maximum number of devices concurrently. According to another exemplary embodiment of the present invention, pairs of DC-DC converters can operate in parallel to test devices using a wider range of DC currents than available when operating in the independent mode. According to yet another exemplary embodiment of the present invention, pairs of DC-DC converters can operate in a differential mode to test devices over a wider range of DC voltages than available when operating in the independent mode.

Another aspect of the present invention relates to coordinating control of the plurality of DC-DC converters. In addition to the mode control discussed above, the duty cycle of each converter is controlled to reduce the overall current harmonics as seen by the AC inverter. Duty cycle control varies depending upon, for example, the mode in which each converter is operating and the polarity of the current through each converter. By controlling duty cycles according to the present invention to suppress current harmonics, energy efficiency is increased.

BRIEF DESCRIPTION OF THE DRAWINGS

The present invention can be further understood with reference to the following description in conjunction with the appended drawings, wherein like elements are provided with the same reference numerals. In the drawings:

FIG. 1 is a functional block diagram of a known battery testing device;

FIG. 2 is a functional block diagram of a system for cycling loads and sources according to the present invention;

FIG. 3 is a more detailed electrical equivalent diagram of the exemplary embodiment of FIG. 2;

FIGS. 4(a)–4(c) show configurations of paired DC-DC converters when operated in an independent mode, a parallel mode, and a differential mode, respectively, according to exemplary embodiments of the present invention; and FIGS. 5(a)–5(b) are waveforms which show phasing of duty cycles between paired converters according to exemplary embodiments of the present invention.

DETAILED DESCRIPTION OF THE PREFERRED EMBODIMENT

FIG. 2 depicts a functional block diagram of a system for cycling loads and sources. In the system of FIG. 2, a utility is connected through isolation transformer 30 to AC inverter 32. This portion of the circuitry is similar to that described in FIG. 1, although an EMI filter is not shown in this general functional block diagram to simplify the illustration. A control unit 33 controls switching within the AC inverter and, via control bus 35, within each DC-DC converter. A predetermined DC bus voltage is placed on the intermediate DC bus, which includes the two bus lines indicated generally by reference numeral 34 in FIG. 2, by AC inverter 32. The DC bus voltage is selected to be a minimum voltage necessary to test devices envisioned to be connected to the apparatus, e.g., loads A and B.

The system of FIG. 2 can include any number of DC-DC converters connected to AC inverter 32. This is portrayed in the exemplary embodiment of FIG. 2 by a first DC-DC converter pair 36 and any number of additional converter pairs. Moreover, although certain modes of operation provide for controlling DC-DC converter pairs, converters can also be provided both singly and in pairs, with the single converters then being operated in the independent mode described below.

When operating independently, each DC-DC converter is controlled by control unit 33 to transform the DC bus voltage level into a desired DC voltage level for testing its respective load. Control unit 33 can adjust the output load line of each DC-DC converter according to a user-defined program in order to simulate any desired conditions, e.g., battery charging and discharging patterns. This operation will now be described with reference to the more detailed circuit of FIG. 3. Therein isolation transformer 30 and AC inverter 32 operate as previously described to provide a DC bus voltage to intermediate DC bus 34. The capacitor 38 isolates the exchange of ripple currents between inverter 32 and converters 36. The capacitors 40 and 42 isolate ripple currents provided within converters 36 from their respective loads. Although only one DC-DC converter pair is shown in FIG. 3, as mentioned above additional DC-DC converters can also be connected, either in pairs or singly, and will operate in a similar manner. Pairs of DC-DC converters such as the pair shown in FIG. 3 can be operated in any one of independent, parallel or differential modes described below.

Initially, the operation of each DC-DC converter pair in the independent mode will be described in order to provide a general understanding of converter operation. A first DC-DC converter includes switches 44 and 46 and inductor 48 which provides a controlled DC voltage to DC port A. Similarly, switches 50 and 52 and inductor 54 make up a second DC-DC converter pair which can be used to provide a controlled DC voltage to DC port B. The switches 44, 46, 50 and 52 are shown diagrammatically in FIG. 3, however each of these switches can be fabricated as a combination of a semiconductor switch (e.g., a bipolar transistor or an IGBT) and a diode. For example, control unit 33 can control the duty cycles at which switches, 44 and 46 open and close to store and release energy in inductor 48 and thereby apply any desired portion of the DC bus voltage to DC port A. For a more detailed example of how switching in a single bidirectional DC-DC converter can be performed, the interested reader is directed to U.S. Pat. No. 4,894,765 to Kähkipuro, which disclosure is incorporated here by reference.

Unlike the single bidirectional DC-DC converter described in U.S. Pat. No. 4,894,765, at least one pair of DC-DC converters 36 can be provided to systems according to the present invention to provide different modes of operation, i.e., independent, parallel and differential. The operational mode is selectable by the system operator and implemented by the control unit 33 which closes pairs of contacts 56, 58 and 60 based upon the selected mode. The independent mode has been described above and allows each DC-DC converter in a pair to provide independently controllable voltage from, for example, near zero volts to near the DC bus voltage of intermediate bus 34 to, for example, each of loads A and B. FIG. 4(a) provides an illustration which depicts the DC bus connections for operating the master and slave DC-DC converters in a pair to independently test loads A and B. The independent mode can be implemented in the exemplary system of FIG. 3 by control unit 33 closing contacts 56 and 60 while leaving contacts 58 open.

In the system in FIG. 2, DC-DC converter pairs can also be operated in parallel. In this parallel mode, a controllable DC voltage within a range similar to that provided in the independent mode can be applied to a single load connected to DC port A. However, by configuring the two DC-DC converters for operation in parallel, the current and power available for testing will be substantially twice that available when operating the system in the independent mode. An exemplary parallel configuration is shown as FIG. 4(b). To operate the exemplary DC-DC converter pair of FIG. 3 in parallel, control unit 33 will close contacts 56 and 58, while leaving contacts 60 open.

Another operational mode available to the system of FIG. 2 is a differential mode. In the differential mode, the voltage applied to the load under test, connected between the positive terminal of DC port A and the positive terminal of DC port B, is a controlled difference between the voltages generated by each converter. FIG. 4(c) shows an exemplary differential mode configuration. This configuration can be implemented by control unit 33 in FIG. 3 closing contacts 56 and 60, while leaving contacts 58 open and allows control unit 33 to provide test voltages ranging between approximately plus and minus the voltage on the intermediate DC bus 34. Accordingly, the differential mode provides a greater voltage range for testing by including negative voltages. This capability is useful for testing motors and actuators which require up to four quadrants of voltage-currents excitation.

As can be understood from the foregoing, an operator can select any one of the three operational modes for each DC-DC converter pair 36 (or the independent mode for single converters) using an interface (not shown) on control unit 33. The control algorithm within the control unit 33 is such that contactors 56, 58 and 60 are not energized until the respective convertor and load voltages are nearly equal. To provide this capability voltage sensors (not shown) can be attached across the outputs of the DC-DC converters and provide voltage level information through control bus 35 to control unit 33. In this way, both capacitors 40 and 42 are protected from current surges which otherwise would occur when the electrical path through the capacitors is closed. Likewise, the load is protected from such current surges.

In addition to providing the capability to operate paired DC-DC converters in the above-described different modes, the system of FIG. 2 can also coordinate the operation of the paired DC-DC converters to minimize current harmonics. More specifically, control unit 33 times the opening and closing of the switches 44, 46, 50, and 52 such that the duty cycles of the two converters are either in phase or 180 degrees out of phase. The phasing selection made by control unit 33 is a function of operating mode and current polarity through the converter. For example, if the parallel operating mode is selected, or if the independent operating mode is selected and the current polarities in each converter are the same, then the control unit 33 operates switches 44, 46, 50 and 52 such that the duty cycles of the paired DC-DC converters are 180 degrees out of phase. This phasing is shown by the waveforms as shown in FIG. 5(a).

If, on the other hand, the differential mode is employed or the independent mode is selected and the current polarities in each converter differ, then the duty cycles of the two converters are configured to be in phase as shown in FIG. 5(b).

The foregoing has described the principles, preferred embodiments and modes of operation of the present invention. However, the invention should not be construed as limited to the particular embodiments discussed. Instead, the above-described embodiments should be regarded as illustrative rather than restrictive, and it should be appreciated that variations can be made in those embodiments by workers skilled in the art without departing from the scope of present invention as defined by the following claims. For example, although several of the above-described exemplary embodiments mentioned testing of loads and systems therefor, the present invention is not limited to testing loads but can test sources, e.g., motors, since connection to a utility provides the capability to supply or absorb current.

What we claim is:

1. A system for sourcing and sinking electrical power comprising:
    a poly-phase utility port for connecting the system with an electrical utility;
    a device connected to the poly-phase utility port for interfacing the poly-phase utility port with a DC bus to provide a first DC voltage level thereon;
    at least one bi-directional DC-to-DC converter for converting the first DC voltage level to at least one second DC voltage level; and
    a controller for coordinating operation of the at least one bidirectional DC to DC converter.

2. The apparatus of claim 1, wherein the controller coordinates operation of the at least one bidirectional DC-to-DC converter to reduce current harmonics.

3. The apparatus of claim 2, wherein the controller reduces current harmonics by controlling a phase relationship between duty cycles of the at least one bidirectional DC-to-DC converter.

4. The apparatus of claim 1, wherein the controller coordinates operation of the at least one bidirectional DC-to-DC converter such that at least one pair of the at least one bidirectional DC-to-DC converter operates in parallel.

5. The apparatus of claim 4, wherein the controller operates switches associated with a first of the at least one bidirectional DC-to-DC converter according to a first duty cycle and operates switches associated with a second of the at least one bidirectional DC-to-DC converter according to a second duty cycle, and wherein the first and second duty cycles are out of phase with respect to one another.

6. The apparatus of claim 5, wherein the first and second duty cycles are 180 degrees out of phase.

7. The apparatus of claim 1, wherein the controller operates switches associated with a first of the at least one bidirectional DC-to-DC converter according to a first duty cycle and operates switches associated with a second of the at least one bidirectional DC-to-DC converters according to a second duty cycle, and wherein the first and second duty cycles are phased with respect to one another based upon a polarity of current through the first and second DC-to-DC converters.

8. The apparatus of claim 1, wherein the controller coordinates operation of the at least one bidirectional DC-to-DC converter such that at least one pair of the at least one bidirectional DC-to-DC converter operates differentially.

9. The apparatus of claim 8, wherein the controller operates switches associated with a first of the at least one bidirectional DC-to-DC converter according to a first duty cycle and operates switches associated with a second of the at least one bidirectional DC-to-DC converter according to a second duty cycle, and wherein the first and second duty cycles are in phase with respect to one another.

10. The system of claim 1, wherein said at least one bidirectional DC-to-DC converter further comprises:
    first and second switches;
    an inductor connected in parallel between said first and second switches; and
    a capacitor for isolating ripple currents generated by said at least one bidirectional DC-to-DC converter.

11. A system for testing at least one electrical device comprising:
    a DC bus driven at a DC voltage;
    a pair of bidirectional DC-to-DC converters for controllably converting the DC voltage and providing at least one output DC voltage; and
    a controller for connecting the pair of bidirectional DC-to-DC converters to operate in one of a parallel and a differential mode.

12. The apparatus of claim 11, wherein the controller coordinates operation of the pair of bidirectional DC-to-DC converters to reduce signal harmonics.

13. The apparatus of claim 11, wherein the controller reduces signal harmonics by controlling a phase relationship between duty cycles of the pair of bidirectional DC-to-DC converters.

14. The apparatus of claim 11, wherein the controller operates the pair of bidirectional DC-to-DC converters in parallel by electrically connecting a positive voltage output of one of the pair of bidirectional DC-to-DC converters to a positive voltage output of another of the pair of bidirectional DC-to-DC converters.

15. The apparatus of claim 14, wherein the controller operates the pair of bidirectional DC-to-DC converters differentially by electrically connecting a load between the positive voltage output terminals of each of the pair of bidirectional DC-to-DC converters.

16. The apparatus of claim 15, wherein the controller operates switches associated with a first of the pair of bidirectional DC-to-DC converters according to a first duty cycle and operates switches associated with a second of the pair of bidirectional DC-to-DC converters according to a second duty cycle, and wherein the first and second duty cycles are in phase with respect to one another.

17. The apparatus of claim 14, wherein the controller operates switches associated with a first of the pair of bidirectional DC-to-DC converters according to a first duty cycle and operates switches associated with a second of the pair of bidirectional DC-to-DC converters according to a second duty cycle, and wherein the first and second duty cycles are out of phase with respect to one another.

18. The apparatus of claim 17, wherein the first and second duty cycles are 180 degrees out of phase.

19. The apparatus of claim 11, wherein the controller operates the pair of bidirectional DC-to-DC converters such that each of the bidirectional DC-to-DC converters operates independently of the other.

20. The apparatus of claim 19, wherein the controller operates switches associated with a first of the pair of bidirectional DC-to-DC converters according to a first duty cycle and operates switches associated with a second of the pair of bidirectional DC-to-DC converters according to a second duty cycle, and wherein the first and second duty cycles are phased with respect to one another based upon a polarity of current through the first and second bidirectional DC-to-DC converters.

21. The system of claim 11, wherein said pair of bidirectional DC-to-DC converters each further comprise:
    first and second switches;
    an inductor connected in parallel between said first and second switches; and
    a capacitor for isolating ripple currents generated by an associated one of said pair of bidirectional DC-to-DC converters.

22. A system for sinking and sourcing electrical power comprising:
    a poly-phase utility port for connecting the system with an electrical utility;
    a device connected to the poly-phase utility port for interfacing the poly-phase utility port with a DC bus to provide a first DC voltage level thereon;

at least one DC-to-DC converter for converting the first DC voltage level to at least one second DC voltage level; and a controller for coordinating operation of the at least one DC to DC converter wherein the controller reduces current harmonics by controlling a phase relationship between duty cycles of the at least one DC-to-DC converter.

23. The system of claim 22, wherein said at least one DC-to-DC converter is a bidirectional DC-to-DC converter.

24. The system of claim 23, wherein said at least one bidirectional DC-to-DC converter further comprises:

first and second switches;

an inductor connected in parallel between said first and second switches; and a capacitor for isolating ripple currents generated by said at least one bidirectional DC-to-DC converter.

\* \* \* \* \*

UNITED STATES PATENT AND TRADEMARK OFFICE

CERTIFICATE OF CORRECTION

PATENT NO. : 5,751,150

DATED : May 12, 1998

INVENTOR(S) : RIPPEL, et al.

It is certified that an error appears in the above-identified patent and that said Letters Patent is hereby corrected as shown below:

In Col. 1, line 5, insert "This invention was made with Government support under sub-subcontract TCB02 751, Subcontract No. NREL-ZCB-3-13032-01 awarded by the U.S. Department of Energy. The Government has certain rights in the invention."

Signed and Sealed this

Twenty-second Day of August, 2000

Attest:

Q. TODD DICKINSON

Attesting Officer

Director of Patents and Trademarks